US008764997B2

(12) United States Patent
Porro et al.

(10) Patent No.: US 8,764,997 B2
(45) Date of Patent: Jul. 1, 2014

(54) SURFACE TREATMENT OF AN ORGANIC OR INORGANIC SUBSTRATE FOR ENHANCING STABILITY OF A LITHOGRAPHICALLY DEFINED DEPOSITED METAL LAYER

(75) Inventors: Fabrizio Porro, Portici (IT); Luigi Giuseppe Occhipinti, Ragusa (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 749 days.

(21) Appl. No.: 12/835,011

(22) Filed: Jul. 13, 2010

(65) Prior Publication Data
US 2011/0006032 A1    Jan. 13, 2011

(30) Foreign Application Priority Data
Jul. 13, 2009 (IT) .............................. VA2009A0049

(51) Int. Cl.
H01L 21/302 (2006.01)
H01L 21/461 (2006.01)
H01L 21/311 (2006.01)
H01B 13/00 (2006.01)
C03C 15/00 (2006.01)
C03C 25/68 (2006.01)
C23F 1/00 (2006.01)

(52) U.S. Cl.
USPC ............. 216/13; 438/689; 438/705; 438/745; 438/747; 438/754; 216/41

(58) Field of Classification Search
None
See application file for complete search history.

(56) References Cited

U.S. PATENT DOCUMENTS

| 4,690,715 | A | | 9/1987 | Allara et al. |
| 5,350,484 | A | * | 9/1994 | Gardner et al. ............... 438/669 |
| 5,501,870 | A | * | 3/1996 | Shiraishi et al. .................. 427/8 |
| 5,945,486 | A | * | 8/1999 | Vargo et al. ................ 525/326.2 |
| 6,348,240 | B1 | * | 2/2002 | Calvert et al. ................. 427/539 |
| 6,649,327 | B2 | * | 11/2003 | Kim et al. ..................... 430/313 |
| 6,736,985 | B1 | * | 5/2004 | Bao et al. ........................ 216/13 |
| 6,780,467 | B2 | * | 8/2004 | Imori ............................ 427/304 |
| 2003/0117598 | A1 | * | 6/2003 | Case et al. ...................... 355/53 |
| 2005/0087289 | A1 | | 4/2005 | Toyoda |
| 2007/0196577 | A1 | * | 8/2007 | Nakagawa .................... 427/282 |

FOREIGN PATENT DOCUMENTS

EP      1683571      7/2006

OTHER PUBLICATIONS

Celle et al., Self-assembled monolayers for electrode fabrication and efficient threshold voltage control of organic transistors with amorphous semiconductor layer, Organic Electronics, vol. 10, 2009 pp. 119-126.

* cited by examiner

*Primary Examiner* — Nadine Norton
*Assistant Examiner* — Stephanie Duclair
(74) *Attorney, Agent, or Firm* — Allen, Dyer, Doppelt, Milbrath & Gilchrist, P.A. Attorneys at Law

(57) ABSTRACT

A method of metal deposition may include chemically modifying a surface of a substrate to make the surface hydrophobic. The method may further include depositing a layer of metal over the hydrophobic surface and masking at least a portion of the deposited metal layer to define a conductive metal structure. The method may also include using an etching agent to etch unmasked portions of the deposited metal layer.

14 Claims, 1 Drawing Sheet

SURFACE TREATMENT OF AN ORGANIC OR INORGANIC SUBSTRATE FOR ENHANCING STABILITY OF A LITHOGRAPHICALLY DEFINED DEPOSITED METAL LAYER

FIELD OF THE INVENTION

This invention relates in general to stabilization of metal layers deposited onto non-metallic substrate. In particular, this invention relates to stabilization of metal films onto non-metallic substrates used in the microelectronics industry and, more particularly, to fabrication processes of thin film circuits and devices employing low cost fabrication techniques, as for example, definition of integrated electronic circuits by printing techniques (printed electronics).

BACKGROUND OF THE INVENTION

Deposition of metal films onto non-metallic inorganic (glass, silicon, quartz) and organic (polystyrene (PS), poly (methyl metha-crylate) (PMMA), polyethylene naphthalate (PEN), etc.) substrates is a common practice in industrial applications spanning from microelectronics to medicals (for example in dental care), artistic manufacture, for example, decorated porcelains and glasses, and many others. During fabrication processes, deposited metal films often undergo chemical and mechanical stresses. In particular, in the fabrication of microelectronic devices, both through the use of conventional techniques based on photolithography as well as through innovative printing methods, such as microcontact printing (μCP), deposited metal films may be subjected to wet or dry etching and/or peel-off treatments for creating a design functional patterning. Further details of microcontact printing may be disclosed in Xia, Y.; Whitesides, G. M. Langmuir 1997, 13, 2059-2067.

Should the deposited metal film not adhere properly to the substrate, these treatments may cause cracking and/or partial peeling of the patterned metal structure with a consequent reduction of mechanical and electrical properties. This problem is particularly acute when the deposited metal is gold, the adhesion of which to non-metal substrates is rather low. Enhancement of adhesion processes of deposited metal films is typically of paramount importance because it may significantly improve production yield on an industrial scale.

The poor adhesion properties of metals onto certain substrates may depend on specific interactions between metal and the substrate (chemical bonds, diffusivity), and on metal nucleation properties of the surface of the substrate receiving the deposited metal. For example, adhesion of metals onto oxide substrates (glass, silicon oxide, quartz), strongly depends on the affinity of the specific metal towards oxygen. In particular, the larger the heat of formation of the metal oxide, the greater is its adhesion to the oxide.

This explains, for instance, the poor adhesion of gold (formation heat of $Au_2O_3$=19 kcal/mole) compared to the very good adhesion of aluminum (formation heat of $Al_2O_3$=-399 kcal/mole). For this reason, in microelectronic fabrication processes, before depositing gold onto oxide substrates, it is usually preferred to interpose a metal layer having a good affinity with oxygen such as tantalum, aluminum, vanadium, chromium, titanium, tungsten or molybdenum as a bonding agent between gold and the substrate.

However, this method generally requires an additional metal deposition step, with a consequent increase of fabrication complexity and costs. Moreover, in fabrication processes that contemplate a selective etching of the deposited gold for patterning it, the under-laying adhesion layer may require a specific etching step not always compatible with the patterned gold portions. This is the case, for example, for the patterning of gold structures through microcontact printing of alkanethiols, wherein the etching of gold by alkaline solutions of iron cyanide would be ineffective with most metals that are normally used as an adhesion interlayer.

As an alternative, according to the prior art, adhesion of gold onto non-metallic substrates may be promoted with mercaptomethoxysilanes that are molecules capable of chemically bonding to both oxides and gold atoms. See for example, Celle, C.; Suspene, C.; Simonato, J.-P.; Lenfant, S.; Ternisien, M.; Vuillaume, D.; *Organic Electronics*, 2009, 10, 119-126.

However, this technique contemplates the use of organic solvents such as toluene, benzene, or other aromatic derivatives, and thus may hinder their use on plastic substrates. Plastic substrates may form the basis of important applications, of "Printed Electronics/Electronics on plastic foils." That is they form the basis of all those printing techniques, including the microcontact printing technique for low cost applications.

SUMMARY OF THE INVENTION

A method of increasing the adhesion stability of a deposited metal layer onto the surface of an inorganic or organic substrate subjected to wet etching and of lift off attacks of the metal has been found by the applicant. The method may be achieved, through a hydrophobization of the substrate surface before the metal deposition.

An effective hydrophobization of the metal deposition surfaces may be obtained either through a functionalization of the surface by disposing suitable functionalizing molecules onto the surface, and/or through a modification of the morphology at a micrometric and sub-micrometric level (Lotus leaf effect). In practice, any hydrophobization method that may be optimal to the particular type of substrate and to the specific fabrication process may be used to attain the objectives of this invention.

Hydrophobization is found to be increasingly effective when it determines an increase of the contact angle with water or an aqueous solution to a value exceeding 90°. The process, based on exploiting a reduction of the penetration power of the etching and peel-off solutions, has a more general applicability because it does not depend on specific chemical interactions between metal and thyolic groups supported by a functionalizing molecule.

A further aspect of the method is that, when deposited onto the functionalized substrate, the metal film is found to possess significantly better morphological and mechanical properties that those relative to the same film deposited onto non functionalized (blank) substrate. This further advantageous aspect in the improvement of the quality of the metal film is thought to be attributed to a significant increase of the number of nucleation sites, and to a reduction of the diffusivity of atoms of the metal because of the functionalization of the receiving surface of the substrate.

DETAILED DESCRIPTION OF THE PREFERRED EMBODIMENTS

Figure 1A:
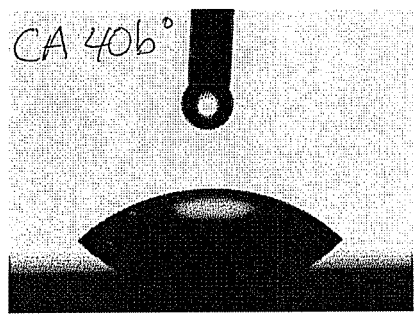
FIGS. 1*a* and 1*b* are microphotographs of wettability (contact angle) before and after surface treatment respectively, according to the present invention.

A hydrophobization process, particularly effective and usable onto substrates both of inorganic (silicon oxide, quartz, glass) and organic (polymeric materials such as, for example, polyethylene terephthalate (PET), polystyrene (PS), and polyethylene naphthalate (PEN)) is based on covalent chemical bonding (hereinafter called "silanization") of ethoxy alkane silanes perfluorinated (such as for example those corresponding to the commercial label Fluorolink S10, distributed by Solvay Solexis) to hydroxyl groups present on the surface of the substrate. These commercial molecules are normally used in an alcoholic solution, and this makes it possible to use them over a large variety of substrates.

As will be demonstrated hereinafter, the stabilization effect that is obtained is particularly effective in fabricating metal structures patterned by microcontact printing. Nevertheless, as previously stated, other hydrophobization methods of the surface of substrates may be used, as an alternative, for stabilizing metal layers to be defined on the substrate.

Before carrying out the functionalization of the surface to be rendered hydrophobic, the substrate surface is treated with an oxygen plasma (O2) for polishing the surface from eventual organic contaminants and for creating and/or activating hydroxyl groups (—OH). A sequence of operations and phases follows this first pre-activation step of the substrate surface, as disclosed hereinbelow.

Phase 1) Substrate Hydrophobization

For hydrophobization based on a covalent chemical bonding to the surface of the substrate of perfluorinated ethoxy alkane silanes, a compound with one of the following formulations may be used:

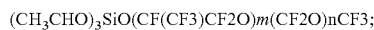

Alternatively, chlorine or perfluorinated methoxy silane may be used.

This phase may include the following process steps:

Step 1—Preparation of the Solution And Immersion of the Substrate (Deep Coating)

It may be possible to use the following standard composition (from the datasheet Fluorolink S10) of the solution of the silanizing agent:
0.1-1% Fluorolink S10;
0.4%-4.0% wt acqua (4/1 wt/wt ratio water/Fluorolink S10);
0.1-1.0% wt acetic acid or HCl 10% (1/1 wt/wt ratio acetic acid/Fluorolink S10); and
99.4-94.0% wt isopropyl alcohol.

In this first step, after at least 30 minutes from the moment the solution is prepared, the substrate is immersed in the solution for a few seconds. As an alternative, the solution may be applied onto the substrate by spray coating, spin coating, or roller coating. In this step a molecular thick layer of perfluorinated ethoxy alkane silane is disposed onto the surface of the substrate.

Step 2—Curing

The coated substrate is subjected to a curing treatment, for example at 100° C. for 15 minutes and successively at about 150° C. for another 15 minutes. In the case of polymeric substrates, the curing of the coating film may be carried out at 50° C. for three hours. During this curing step chemical bonds form among the silanizing agent and —OH groups present at the surface of the substrate. This leads to the formation of a self assembled molecular monolayer (SAM).

Step 3—Sonication

Figure 1B:
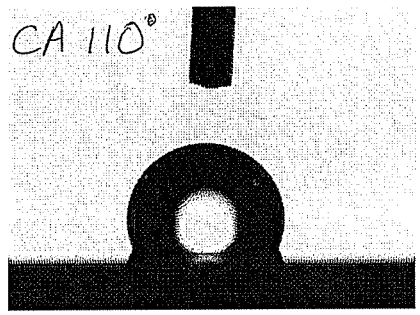

After the curing step, the functionalized substrates are subjected to sonications in isopropanol and water for removing excess reagent. Measures of contact angle demonstrate hydrophobization of the surface of the treated substrate. Contact angles of water greater than 100° are observable in the treated sample, as shown in the microphotographs of FIGS. 1a and 1b. The treated substrate is now ready for metal deposition.

Phase 2)—Metallization

The metal deposition technique should be compatible with the molecular monolayer formed on the surface of the substrate. In the tests carried out, a vacuum thermal evaporation technique of depositing gold on the functionalized (hydrophobized) surface of the substrate was used. For example, a gold layer 20 nm thick was deposited at a pressure of $10^{-6}$ mbar and at a rate of 0.5 nm/s.

Phase 3)—Definition of Metal Structures Through Microcontact Printing

Step 1—Microcontact Printing of Alkanthiols

According to this fabrication technique, a polydine thylsiloxane (PDMS) mold includes the positive pattern of the gold structure to be formed. The PDMS mold is immersed for several seconds in a solution in ethanol of an alkanthiol 0.8 mM (examples of suitable alkanthiol are octadecyl thiol and eicosanthiol though others may be used). After drying in a nitrogen anhydrous flux, the mold is brought in conformal contact with the gold coated substrate (obtained in the example through Phases 1 and 2). The duration of the conformal contact may be of about 30 seconds. In this step molecules of alkanthiol are transferred from the PDMS mold to the gold layer at contact mold-substrate points. The chemical reaction between the groups —SH and surface gold atoms is almost immediate and leads to the formation of a molecular thick mask of alkanthiols that reproduces, on the gold film, the pattern of the PDMS mold. This mask will protect the gold from the etching solution. Thiols covalently bind to gold forming highly ordered and stable self-generating SAM films.

Step 2—Wet Etching

In this step, the patterned gold coated substrate with alkanthiols is immersed for about 5 minutes in an aqueous solution of $K_2S_2O_3/K_3Fe$—$(CN)_6/K_4Fe(CN)_6$ o $KCN/O_2$ (wet etching). The etching solution etches the unprotected gold defining the deposited film according to the pattern transferred from the PDMS mold, and thus the designed metal structures.

According to prior art practices, this operation is well recognized as extremely critical for the stability of the defined features of the remaining parts of the gold film because the etching solution tends to seep between the substrate and the gold film causing unwanted leaching and delamination. This may lead to a complete detachment of parts of the deposited metal film being defined.

Figure 2A:
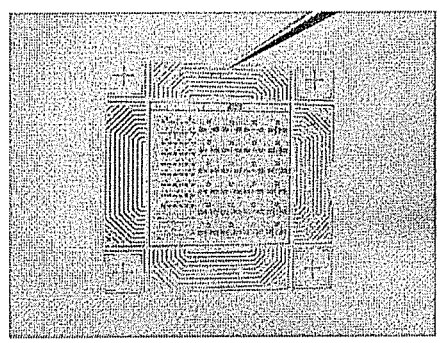
FIGS. 2*a* and 2*b* are microphotographs of patterned metal structures according to the present invention.
Figure 2B:
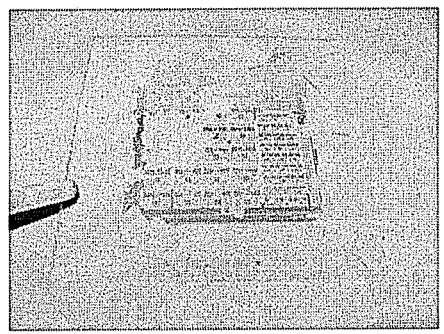

The hydrophobization treatment may eliminate or significantly reduce the importance by effectively impeding/contrasting penetration of the etching solution in the gold-substrate interface. The deposited gold film is extraordinarily stable, and the etching process defines less defective metal structures, as shown in the microphotographs of FIG. 2.

The process of stabilization of metal films deposited onto inorganic and organic substrates for an enhanced tolerance toward etching solutions has advantages compared to the interposition of a compatibilization metal layer, such as, for example, an intermediate layer of Cr, Ni, Ti, etc., before depositing a top metallization layer of gold or aluminium because it reduces the number of process steps and has a lower cost. The process is also advantageous compared to the prior art practice of using molecules of SAM silan-thyolic as anchoring groups of the metal to the substrate (such as for example mercapto methoxy silanes), because the process is more widely applicable to a variety of metals and substrates by virtue of the fact that, in contrast to the prior art, it exploits a physical interface property and not specific substrate-metal chemical interactions.

That which is claimed is:

1. A method of metal deposition comprising:
    chemically modifying a surface of a substrate to make the surface hydrophobic by at least
        exposing the surface to an oxygen plasma,
        contacting the surface with a silanizing agent to form a silanized surface,
        thermally curing the silanized surface to produce chemical bonds between the silanizing agent and surface hydroxyl groups of the substrate, and
        performing at least one treatment to remove excess silanizing agent;
    depositing a layer of metal over the hydrophobic surface;
    masking at least a portion of the deposited metal layer to define a conductive metal structure; and
    using an etching agent to etch unmasked portions of the deposited metal layer.

2. The method according to claim 1, wherein performing the at least one treatment comprises performing sonication treatments in alcoholic solvents and water.

3. The method according to claim 1, wherein the silanizing agent is selected from the group consisting of perfluorinated methoxy and ethoxy alkane silane.

4. The method according to claim 1, wherein masking comprises lithographically defining by optical exposition of a photoresist.

5. The method according to claim 1, wherein masking comprises lithographically defining by microcontact printing of alkanethiols.

6. The method according to claim 1, wherein chemically modifying the surface comprises chemically modifying the surface to make the surface have a contact angle greater than 90°.

7. The method according to claim 1, wherein the etching agent comprises an aqueous solution of an etching agent, the etching agent being selected from the group consisting of $K_2S_2O_3$, $K_3Fe-(CN)_6$, $K_4Fe(CN)_6$ and $KCN/O_2$.

8. The method according to claim 1, wherein a silane of the silane solution is selected from the group consisting of chlorinated, methoxylated, and ethoxylated silanes.

9. The method according to claim 8, wherein at least one of the chlorinated, methoxylated, and ethoxylated silanes comprises one of a pure hydrocarbon and a halogenated alkyl chain.

10. The method according to claim 1, wherein chemically modifying the surface comprises chemically modifying the surface to make the surface hydrophobic via a structure of the surface in at least one of a micrometric and nanometric scale.

11. A method of metal deposition comprising:
    chemically modifying a surface of a substrate to make the surface hydrophobic by at least
        exposing the surface to an oxygen plasma, and
        contacting the surface with a silane solution,
        thermally curing the surface to chemically bond the silane solution and the substrate, and
        performing at least one sonication treatment,
    depositing a layer of metal over the hydrophobic surface;
    masking at least a portion of the deposited metal layer; and
    etching unmasked portions of the deposited metal layer.

12. The method according to claim 11, wherein the etching agent comprises an aqueous solution of an etching agent, the etching agent being selected from the group consisting of $K_2S_2O_3$, $K_3Fe-(CN)_6$, $K_4Fe(CN)_6$ and $KCN/O_2$.

13. The method according to claim 11, wherein a silane of the silane solution is selected from the group consisting of chlorinated, methoxylated, and ethoxylated silanes.

14. The method according to claim 13, wherein at least one of the chlorinated, methoxylated, and ethoxylated silanes comprises one of a pure hydrocarbon and a halogenated alkyl chain.

* * * * *